US00RE48260E

(19) United States
(12) Reissued Patent
Yap et al.

(10) Patent Number: US RE48,260 E
(45) Date of Reissued Patent: Oct. 13, 2020

(54) AUTOMATIC RETRANSMISSION IN COMMUNICATIONS SYSTEMS

(71) Applicant: INVT SPE LLC, San Francisco, CA (US)

(72) Inventors: Choo Eng Yap, Singapore (SG); Lee Ying Loh, Singapore (SG)

(73) Assignee: INVT SPE LLC, San Francisco, CA (US)

(21) Appl. No.: 16/109,090

(22) Filed: Aug. 22, 2018

Related U.S. Patent Documents

Reissue of:
(64) Patent No.: 9,425,924
Issued: Aug. 23, 2016
Appl. No.: 14/321,185
Filed: Jul. 1, 2014

U.S. Applications:
(63) Continuation of application No. 11/575,015, filed on Mar. 30, 2007, now Pat. No. 8,775,890.

(30) Foreign Application Priority Data

Sep. 13, 2004 (WO) ..... PCT/JP04/01330

(51) Int. Cl.
*H04L 1/18* (2006.01)
*H03M 13/00* (2006.01)
(Continued)

(52) U.S. Cl.
CPC ..... *H04L 1/1819* (2013.01); *H03M 13/6306* (2013.01); *H04B 7/0413* (2013.01);
(Continued)

(58) Field of Classification Search
CPC ..... H03M 13/6306; H04B 7/0413; H04B 7/0417; H04L 1/1816; H04L 1/1819;
(Continued)

(56) References Cited

U.S. PATENT DOCUMENTS 5,574,979 A 11/1996 West
5,844,918 A 12/1998 Kato
(Continued)

FOREIGN PATENT DOCUMENTS

EP 1404048 3/2004
EP 1615365 1/2006
(Continued)

OTHER PUBLICATIONS

A. Maaref, et al., "A Cross-layer Design for MIMO Rayleigh Fading Channels", Electrical and Computer Engineering, 2004. Canadian Conference, May 2004, pp. 2247-2250, Fig. 1.
(Continued)

*Primary Examiner* — Eron J Sorrell
(74) *Attorney, Agent, or Firm* — Daylight Law, P.C.

(57) ABSTRACT

Automatic retransmission in communications systems. In one embodiment, a portion of data is identified to be retransmitted based on feedback information indicating a negative acknowledgement (NACK) during a cyclic redundancy check (CRC) on a previous transmission of the portion of data. A retransmission mode is selected for the portion of data, from at least a first mode that retransmits the portion of data on at least a first transmitter antenna while transmitting new data on at least a second transmitter antenna, based on first desired transmission characteristics; and a second mode that retransmits the portion of data simultaneously on at least the first and second transmitter antennas, based on second desired transmission characteristics.

28 Claims, 5 Drawing Sheets

(51) Int. Cl.
*H04L 1/06* (2006.01)
*H04B 7/0413* (2017.01)

(52) U.S. Cl.
CPC ..... *H04L 1/0625* (2013.01); *H04L 1/1822* (2013.01); *H04L 1/1825* (2013.01)

(58) Field of Classification Search
CPC ..... H04L 1/1822; H04L 1/1825; H04L 1/189; H04L 1/1893; H04L 1/1896
See application file for complete search history.

(56) References Cited

U.S. PATENT DOCUMENTS

| | | | | |
|---|---|---|---|---|
| 6,636,568 | B2 | 10/2003 | Kadous | |
| 6,920,150 | B1 * | 7/2005 | Pauls | H04L 1/0009 370/465 |
| 7,002,900 | B2 | 2/2006 | Walton | |
| 7,065,144 | B2 | 6/2006 | Walton | |
| 7,248,841 | B2 | 7/2007 | Agee et al. | |
| 7,391,755 | B2 * | 6/2008 | Gopalakrishnan | H04B 7/061 370/334 |
| 7,397,864 | B2 | 7/2008 | Tarokh et al. | |
| 7,450,489 | B2 * | 11/2008 | Sandhu | H04L 5/0048 370/204 |
| 7,453,948 | B2 | 11/2008 | Kim et al. | |
| 7,515,649 | B2 * | 4/2009 | Shim | H04B 7/0671 375/299 |
| 7,668,125 | B2 | 2/2010 | Kadous | |
| 8,451,922 | B2 * | 5/2013 | Dong-Hi | H04B 7/0417 375/130 |
| 8,775,890 | B2 | 7/2014 | Yap | |
| 9,015,546 | B2 | 4/2015 | Yap | |
| 9,397,794 | B2 | 7/2016 | Yap | |
| 9,425,924 | B2 | 8/2016 | Yap | |
| 9,680,611 | B2 | 6/2017 | Yap | |
| 2002/0114740 | A1 | 8/2002 | Yamamoto | |
| 2003/0067890 | A1 | 4/2003 | Goel et al. | |
| 2003/0097629 | A1 | 5/2003 | Moon | |
| 2003/0123389 | A1 | 7/2003 | Russell et al. | |
| 2004/0057530 | A1 | 3/2004 | Tarokh et al. | |
| 2004/0062221 | A1 | 4/2004 | Gopalakrishnan et al. | |
| 2004/0199846 | A1 | 10/2004 | Matsumoto et al. | |
| 2004/0213184 | A1 | 10/2004 | Hu et al. | |
| 2004/0264593 | A1 * | 12/2004 | Shim | H04B 7/0671 375/267 |
| 2005/0002421 | A1 * | 1/2005 | Ito | H04B 1/0483 370/474 |
| 2005/0031050 | A1 * | 2/2005 | Kim | H04L 1/0003 375/267 |
| 2005/0141407 | A1 | 6/2005 | Sandhu | |
| 2005/0251721 | A1 * | 11/2005 | Ramesh | H04L 1/1614 714/748 |
| 2005/0288062 | A1 * | 12/2005 | Hammerschmidt | H04L 1/0002 455/562.1 |
| 2007/0086327 | A1 | 4/2007 | Langley et al. | |
| 2009/0031184 | A1 | 1/2009 | Onggosanusi et al. | |
| 2009/0034644 | A1 | 2/2009 | Sandhu | |
| 2009/0106619 | A1 | 4/2009 | Onggosanusi et al. | |
| 2009/0258609 | A1 | 10/2009 | Miyoshi | |
| 2012/0230257 | A1 | 9/2012 | Yap | |
| 2012/0263250 | A1 | 10/2012 | Yap | |
| 2012/0263256 | A1 | 10/2012 | Waheed | |

FOREIGN PATENT DOCUMENTS

| | | | |
|---|---|---|---|
| EP | 1615365 | | 5/2011 |
| EP | 1404048 | B1 | 9/2016 |
| JP | H1155206 | A | 2/1999 |
| JP | 11055206 | | 3/1999 |
| JP | 2002228669 | | 8/2002 |
| JP | 2002228669 | A | 8/2002 |
| JP | 2004135304 | | 4/2004 |
| JP | 2004135304 | A | 4/2004 |
| WO | 9915871 | A1 | 4/1999 |
| WO | WO 9915871 | | 4/1999 |
| WO | 02087108 | A1 | 10/2002 |
| WO | WO 02/087108 | | 10/2002 |
| WO | 03085875 | A1 | 10/2003 |
| WO | 03086537 | A1 | 10/2003 |
| WO | WO 03/085875 | | 10/2003 |
| WO | WO 03/086537 | | 10/2003 |
| WO | 2004028063 | A1 | 4/2004 |
| WO | WO 2004028063 | | 4/2004 |

OTHER PUBLICATIONS

H. Zeng et al., "Multiple ARQ Processes for MIMO Systems," XP-002347853, EURASIP Journal on Applied Signal Processing, May 2004, pp. 772-782.
Notice of Allowance for U.S. Appl. No. 11/575,015 dated Nov. 8, 2013.
Notice of Allowance for U.S. Appl. No. 13/554,748 dated Apr. 2, 2013.
Notice of Allowance for U.S. Appl. No. 13/554,748 dated Dec. 17, 2014.
Office Action for U.S. Appl. No. 11/575,015 dated Jan. 18, 2012.
Office Action for U.S. Appl. No. 11/575,015 dated Jun. 8, 2012.
Office Action for U.S. Appl. No. 11/575,015 dated Jun. 25, 2010.
Office Action for U.S. Appl. No. 11/575,015 dated Nov. 3, 2010.
Office Action for U.S. Appl. No. 11/575,015 dated Oct. 18, 2011.
Office Action for U.S. Appl. No. 13/478,996 dated Aug. 21, 2012.
Office Action for U.S. Appl. No. 13/478,996 dated Nov. 26, 2012.
Office Action for U.S. Appl. No. 13/532,576 dated Jan. 28, 2013.
Office Action for U.S. Appl. No. 13/532,576 dated Oct. 15, 2012.
Office Action for U.S. Appl. No. 13/554,748 dated Nov. 6, 2012.
Schimunek et ., "AS/400 HTTP Server Performance and Capacity Planning", IBM Manual, International Technical Support Organization, http://www.redbooks.ibm.com, Jan. 2000, 224 pages.
U.S. Appl. No. 14/321,117, filed Jul. 1, 2014, Yap, et al.
PCT International Search Report dated Nov. 22, 2004.
H. Zheng, et al., "Multiple ARQ Processes for MIMO Systems", PIMRC, 2002 Nen 9 Gatsu 15 Nichi-18 Nichi, Fig. 1.
Y. Zou, et al., "A Novel HARQ and AMC Scheme Using Space-time Block Coding and Turbo Codes for Wireless Packet Data Transmission", Proceedings of 2003 International Conference on Communication Technology , 2003. ICCT 2003, Apr. 2003, pp. 1046-1050.
P. Wolniansky, et al., "V-BLAST: An Architecture for Realizing Very High Data Rates over the Rich-scattering Wireless Channel", 1998 URSI International Symposium on Signals, Systems and Electronics, Pisa, Italy, Sep. 29-Oct. 2, 1998, 6 pages total.
V. Tarokh, et al., "Space-Time Block Codes from Orthogonal Designs", IEEE Transactions on Information Theory, Jul. 1999, vol. 45, pp. 1456-1467.
S. Baro, et al., "Improving BLAST Performance using Space-Time Block Codes and Turbo Decoding", Institute for Communications Engineering, Munich University of Technology, 2000, 5 pages total.
N. Shacham, et al., "A Selective-Repeat-ARQ Protocol for Parallel Channels and Its Resequencing Analysis", XP-000297814, IEEE Transactions on Communications, Apr. 1992, pp. 773-782.
A. Milani, et al., "On the use of per-antenna rate and power adaptation in V-BLAST systems for protocol performance improvement", XP-010608807, IEEE Vehicular Technology Conference Proceedings, Sep. 2002, pp. 2126-2130.
Extended European Search report dated Oct. 1, 2012.
Z. Sayeed, "Throughput Analysis and Design of Fixed and Adaptive ARQ/Diversity Systems for Slow Fading Channels", XP-010339471, 1998, pp. 3686-3691.
Chinese Office Action dated Aug. 14, 2009.
European Search Report dated Feb. 9, 2011.

* cited by examiner

AUTOMATIC RETRANSMISSION IN COMMUNICATIONS SYSTEMS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is a continuation of U.S. patent application Ser. No. 11/575,015, filed Mar. 30, 2007, and entitled "AUTOMATIC RETRANSMISSION REQUEST CONTROL SYSTEM AND RETRANSMISSION METHOD IN MIMO-OFDM SYSTEM", which patent claims the benefit and priority of PCT/JP04/13308, filed Sep. 13, 2004, and entitled "AUTOMATIC RETRANSMISSION REQUEST CONTROL SYSTEM AND RETRANSMISSION METHOD IN MIMO-OFDM SYSTEM", and which published as WO 2006/030478 on Mar. 23, 2006. The entire contents of each of the foregoing are expressly incorporated by reference in their entirety herein.

TECHNICAL FIELD

The present invention relates to an automatic repeat request (ARQ) control system and a retransmission method in a multiple-input multiple-output (MIMO) communication system that employs orthogonal frequency division multiplexing (OFDM).

BACKGROUND ART

Simultaneous transmission of multiple data streams is carried out in a MIMO communication system that employs multiple (NT) transmission antennas and multiple (NR) receiving antennas. Depending on the usage, MIMO system contributes to improvement of performance by spatial diversity or contributes to increase of system capacity by spatial multiplexing. The presence of random fading and multipath delay spread in a wireless communication system enables such improvements.

The multiple communication channels present between the transmission antennas and receiving antennas usually change with time and have different link conditions. MIMO systems having feedback provide the transmitter with the channel state information (CSI), allowing the use of methods such as link adaptation and water filling to provide a higher level of performance.

A well-known technique to increase data rate by spatial multiplexing is discussed in Non-Patent Document 1.

Spatial diversity is implemented by space-time block coding, which provides the full advantage of diversity. The space-time block code is disclosed, for example, in Non-Patent Document 2.

MIMO techniques were first designed assuming a narrowband wireless system, namely a flat fading channel. Therefore, it is difficult to achieve high effects in frequency selective channels. OFDM is used in conjunction with MIMO systems to overcome the frequency selective channels proposed by the wireless environment.

OFDM is capable of converting the frequency selective channel into a set of independent parallel frequency-flat subchannels using the inverse fast Fourier transform (IFFT). The frequencies of these subchannels are orthogonal and mutually overlapping, thereby improving spectral efficiency and minimizing inter-carrier interference. Attaching a cyclic prefix to the OFDM symbol further reduces the multipath effects.

With future technology shifting to accommodate a high speed service with increased IP dependency, it is necessary to meet requirements such as spectral efficiencies, system user capacity, end-to-end latency, and quality-of-service (QoS) management. While MIMO-OFDM systems meet some of these criteria, ARQ techniques also play an important role in ensuring fast and reliable delivery.

ARQ is a technique for transmitting a retransmission request for received packet data upon detecting an error in the received packet data. With the transfer of a large volume of high-speed data, more efficient ARQ techniques are typically used to reduce the number of retransmission requests.

It is obviously shown that Hybrid ARQ (HARQ) techniques include chase combining and incremental redundancy and improve efficiency by reducing ARQ overheads. HARQ techniques are primarily designed assuming a single-antenna transmitter and receiver.

Non-Patent Document 1: V-BLAST: an architecture for realizing very high data rates over the rich-scattering wireless channel" by P W Wolniansky et al in the published papers of the 1998 URSI International Symposium on Signals, Systems and Electronics, Pisa, Italy, Sep. 29 to Oct. 2, 1998.

Non-Patent Document 2: Tarokh, V., Jafarkhani, H., Calderbank, A. R.: Space-Time Block Codes from Orthogonal Designs, IEEE Transactions on information theory, Vol. 45, pp. 1456-1467, July 1999, and in WO 99/15871.

DISCLOSURE OF INVENTION

Problem to be Solved by the Invention

However, no technique has been disclosed where HARQ is applied to MIMO-OFDM systems.

In the light of this fact, the present invention has been made, and it is therefore an object of the present invention to provide an automatic repeat request control system and a retransmission method capable of controlling the retransmission methods according to various system requests when HARQ is applied to MIMO-OFDM systems. Further, it is an object of the present invention to achieve improvement of data throughput performance by improving accuracy in the retransmission of signals and reducing the number of retransmission requests.

Means for Solving the Problem

The automatic repeat request control system and retransmission method in a MIMO-OFDM system according to the present invention comprise the following configurations and steps.

An ARQ controlling section module at the transmitter determines whether or not retransmission of signals is required. The module also controls the types of usage schemes when retransmission is required. The ARQ module makes decisions based on ARQ feedback information from the receiver. The system requirements such as whether or not the system allows an error and whether or not the system allows delay also play an important role in the decision process.

In the system of the present invention, the receiver carries out cyclic redundancy checks (CRC) for antenna chains and the transmitter determines whether or not data retransmission is required for transmission antennas by feedback information of acknowledgement (ACK) or negative acknowledgment (NACK) based on a result of CRC from the receiver.

When retransmission is required, the retransmission is carried out according to one of the four retransmission schemes the present invention proposes. An optimal retransmission scheme is selected, based on different system requirements criteria such as latency and performance level.

In the present invention, antennas that receive ACKs are considered to be more reliable than antennas that receive NACKs. Data transmitted by reliable antennas has a higher probability of recovering data correctly.

In one embodiment of the present invention, data for retransmission is transmitted using the same antennas as previous transmission while new data is transmitted using antennas without retransmission requests. This method provides an advantage of reducing complexity accompanying with data retransmission and improving efficiency.

In another embodiment of the present invention, data for retransmission is transmitted using the reliable antennas (antennas without retransmission requests), and new data is transmitted using other antennas. This method provides an advantage of reducing the number of retransmissions required for a certain error packet as well as a drawback of increased complexity.

In another embodiment of the present invention, data retransmission using STBC that is the spatial diversity technique is carried out using reliable antennas. By this method, it is possible to respond to a request even in a system that does not allow error required for accurate retransmission scheme having less delay.

In a further embodiment of the present invention, STBC is also used for data packet retransmission, but retransmission is performed using not only reliable antennas, but also all available antennas. This method is used as the most accurate retransmission scheme and is appropriate for a system that does not allow an error, but allows delay.

A variation of the embodiments using STBC for retransmission uses a higher order of modulation for improved retransmission efficiency.

Variations of the above embodiments include the use of Incremental Redundancy (IR) type of ARQ and retransmission using various sets of interleaving patterns to improve system performance.

A further variation of the above embodiments includes link adaptation using long-term ARQ statistical information. In this case, it is not necessary to perform feedback of channel status information (CSI) and complicated processing.

Effect of the Invention

According to the present invention, it is possible to control the retransmission method according to various system requests when HARQ is applied to MIMO-OFDM systems. Moreover, according to the present invention, it is possible to achieve improvement of data throughput performance by improving accuracy in the retransmission of signals and reducing the number of retransmission requests.

BEST MODE FOR CARRYING OUT THE INVENTION

Now, embodiments of the present invention will be described in detail with reference to the drawings.

Figure 1:
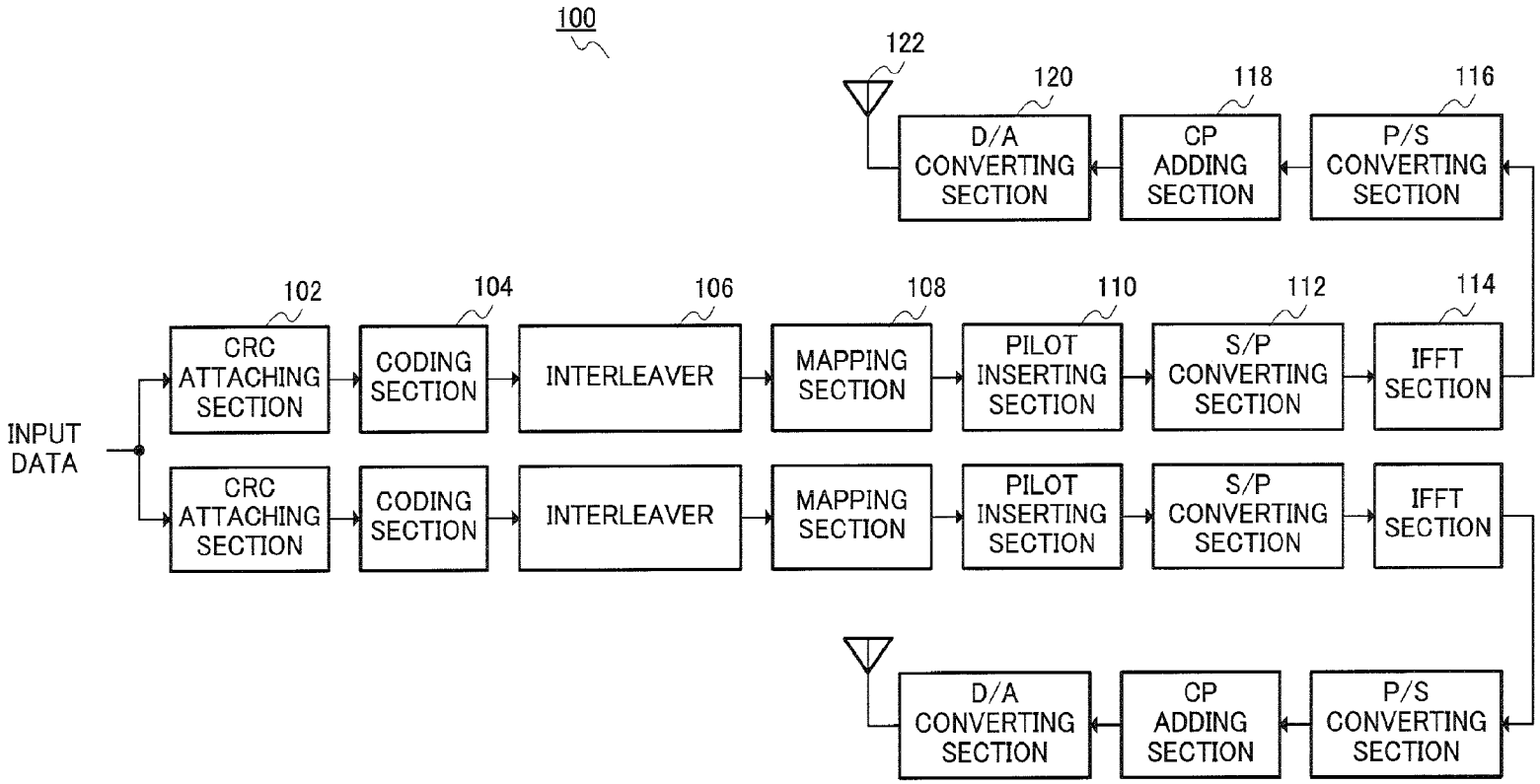
FIG. 1 is a block diagram of the transmitter for the MIMO-OFDM communication system.
Figure 2:
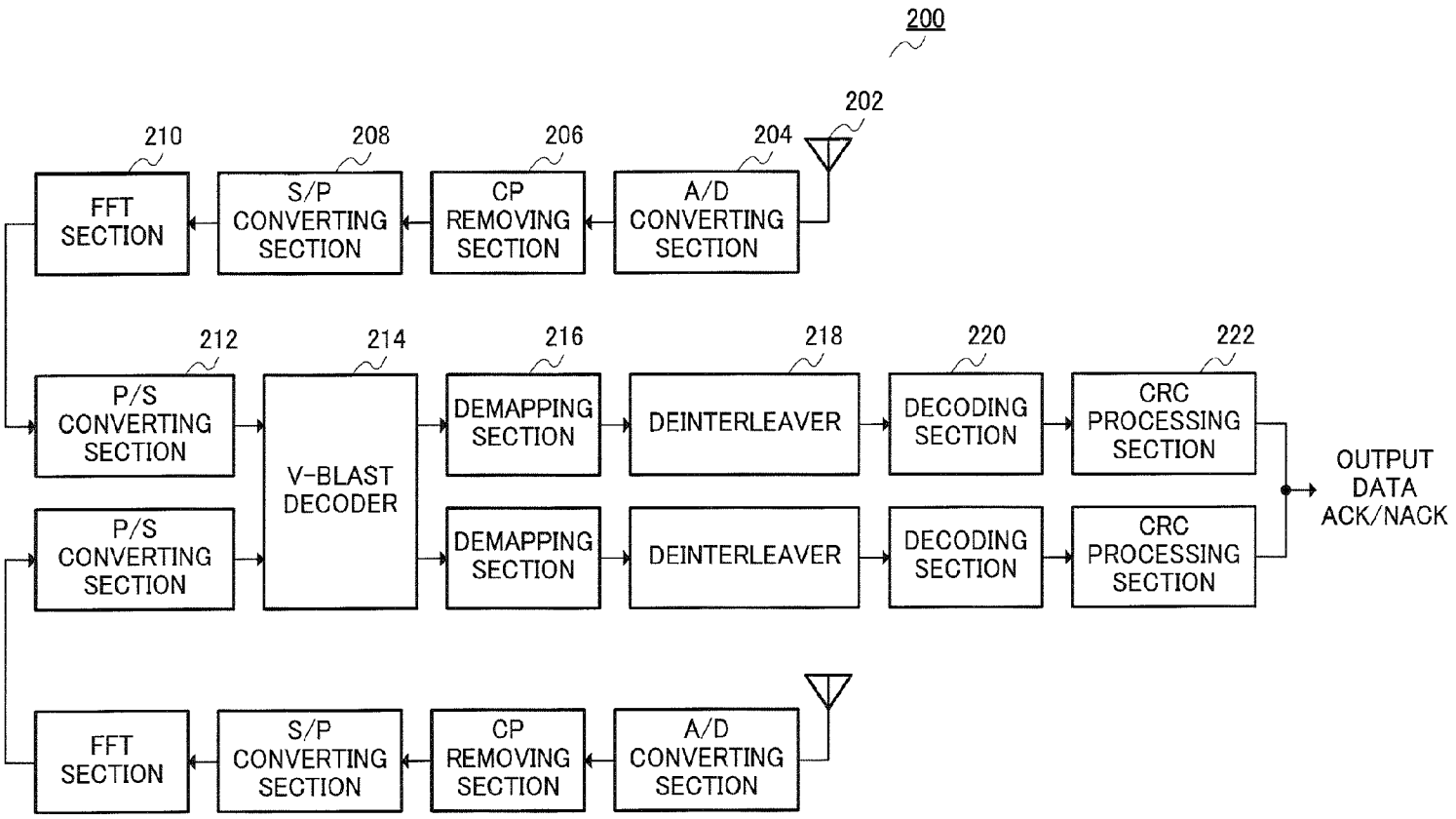
FIG. 2 is a block diagram of the receiver for the MIMO-OFDM communication system.

FIG. 1 is a diagram of transmitter 100 for a multiple-input multiple-output communication system that utilizes orthogonal frequency division multiplexing (namely, a MIMO-OFDM system). FIG. 2 is a diagram of receiver 200 of the same system. Although both figures show the system employing two transmission antennas and two receiving antennas, the present invention can be extended to a system for employing multiple (NT) transmission antennas and multiple (NR) receiving antennas.

At transmitter 100, data processing is performed for each individual antenna chain. Different streams of independent data are transmitted from the individual transmission antennas. The input data is first attached the cyclic redundancy check (CRC) code at CRC attaching section 102. Then, channel coding such as convolutional coding and turbo coding is carried out at coding section 104. The coded data will then be interleaved by interleaver 106 to reduce burst errors in the data. M-ary modulation constellation symbol mapping is executed on the interleaved data at mapping section 108. A pilot signal is inserted in the mapped signal at pilot inserting section 110. Pilot signal insertion makes channel evaluation at the receiver straightforward.

Before carrying out OFDM modulation, the serial data stream is converted into parallel data streams by S/P converting section 112. IFFT section 114 causes the generated subcarriers mutually orthogonal. After the parallel data is converted into serial data by P/S converting section 116, a cyclic prefix for reducing multipath effects is attached to the OFDM symbol by CP attaching section 118. Prior to transmission, the digital signal is converted to analog signal by D/A converting section 120. After the various processes in each transmitter chain, signals become available for transmission through the allocated transmitting antennas 122.

At receiver 200, the reverse processes such as conversion from analog to digital (A/D converting section 204), removal of cyclic prefix (CP removing section 206) and serial parallel conversion (S/P converting section 208) fast Fourier transform (FFT section 210) and parallel serial conversion (P/S converting section 210) are carried out for the received signals from receiving antennas 202. The received signals are comprised of overlapping signals from a plurality of transmission antennas, and it is therefore necessary to separate the signals into the individual streams. In this case, V-BLAST decoder 214, which utilizes zero forcing (ZF) or minimum mean square error (MMSE) techniques, is used to perform this function.

After carrying out demapping (demapping section 216), deinterleaving (deinterleaver 218) and decoding (decoding section 220), cyclic redundancy check (CRC processing section 222) is then performed on each packet to validate the data. If it is determined that the checked packet does not include error, acknowledgment (ACK) is transmitted to the transmitter and the transmitter does not retransmit the packet. If there is an error, a negative acknowledgment (NACK) is transmitted to transmitter 100 for retransmission request.

Figure 3:
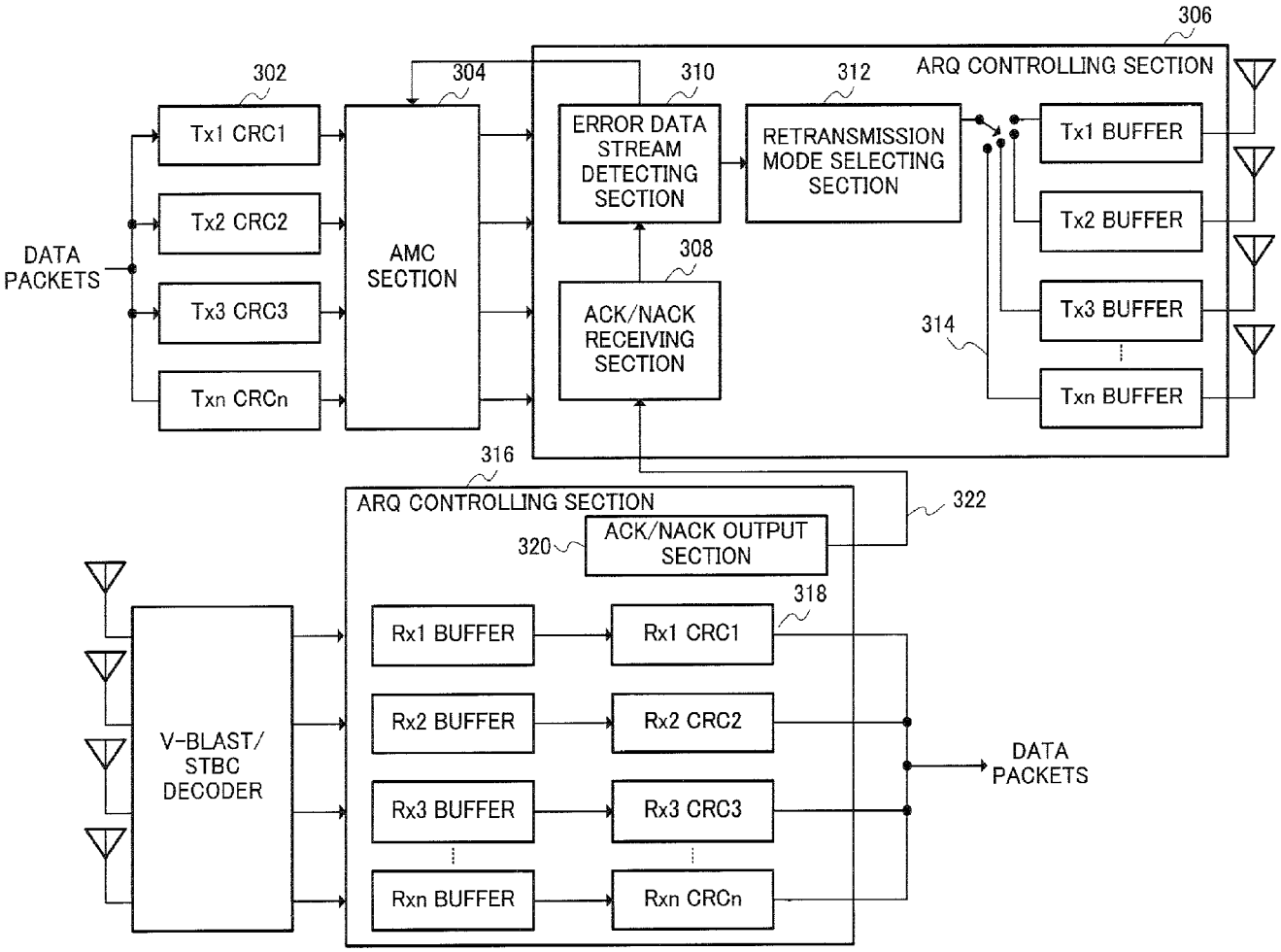
FIG. 3 is a diagram of the functional blocks of the transmission and receiving ARQ controlling section of the present invention.

FIG. 3 is a diagram of the functional blocks of the transmission and receiving ARQ controlling section for the present invention.

As illustrated in FIG. 3, each antenna chain will have its dedicated CRC attaching section 302. Therefore, at ARQ controlling section 316 of the receiver, every data packet on each individual receiving antenna chain will undergo CRC for error detection in CRC processing section 318. The receiver will then feedback ARQ information related to each of the data streams from ACK/NACK output section 320 via fast ARQ feedback channel 322 to a plurality of ACK/NACK receiving sections 308 at ARQ controlling section 306 of the transmitter. This configuration provides an advantage of not requiring data retransmission from all antennas when an error is detected. Only the corrupted data streams require a retransmission. The probability of all data streams having errors is low, and this transmission method leads to an improvement in the data throughput.

Based on the ARQ information obtained at ACK/NACK receiving section 308, error data stream detecting section 310 specifies data streams that require retransmission. Furthermore, error data stream detecting section 310 stores the long-term statistics of ARQ performed, namely the average number of retransmissions occurred at the specific transmission antenna. This information is utilized in the process of M-ary modulation and coding at AMC section 304. For example, if the number of retransmissions as the long-term ARQ statistics for a transmission antenna is smaller than that for other transmission antenna, a higher order of modulation is set at the transmission antenna. To the contrary, for a transmission antenna having a greater number of retransmissions compared to other transmission antenna, a lower order of modulation is set.

If retransmission is required, the retransmission mode selecting section 312 will execute decision process of selecting the appropriate scheme to use for data retransmission. Transmission buffers 314 is updated accordingly.

FIG. 4 to FIG. 7 show the examples of scenarios for the four different retransmission methods proposed in the present invention. The methods will be described below in detail. Each method is suitable for a different set of system requests. Therefore, the method to be executed is a method that is most likely to optimize system performance according to the user requests.

Figure 4:
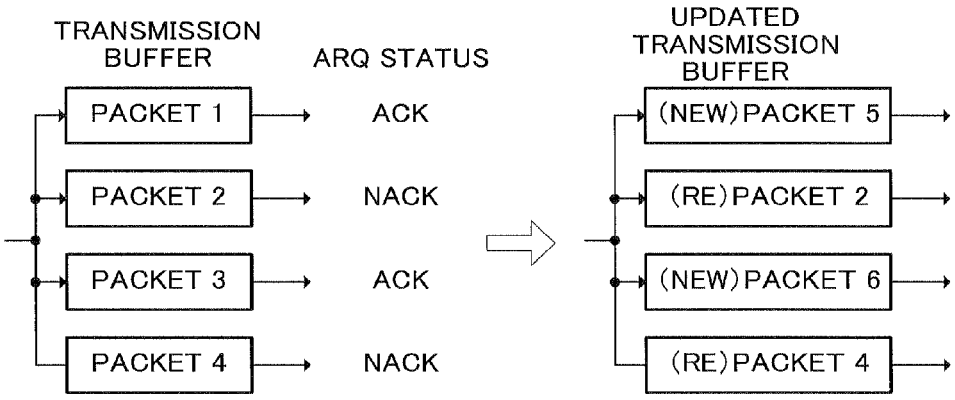
FIG. 4 shows an example of scenario for the retransmission setting of data packets by a retransmission method of the present invention.
Figure 5:
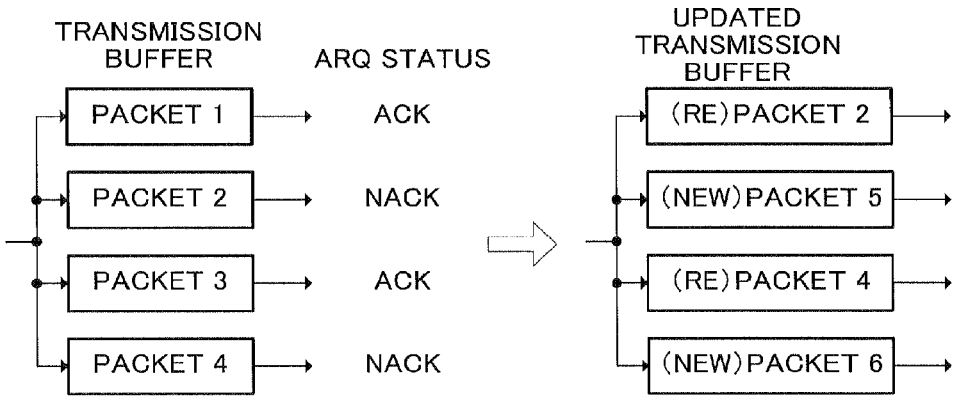
FIG. 5 shows an example of scenario for the retransmission setting of data packets by a retransmission method of the present invention.

FIG. 4 and FIG. 5 depict examples of the previous transmission status and the current retransmission arrangement for methods I and II. Both methods retransmit data only for the corrupted streams while simultaneously transmit new data for antennas which are not used for retransmission purposes. These methods provide advantage of transmitting new data continuously even when retransmission is occurred. Therefore, a consistent level of data rate is maintained without wasting the request for accuracy.

In one embodiment of the present invention, as shown in FIG. 4, packets 1 to 4 are transmitted on each of the transmission antennas. Based on the ACK and NACK information from the receiver, packets 2 and 4 are found to have an error. For retransmission using method I, data to be retransmitted, namely packets 2 and 4, are transmitted using the same antennas as before. New data is transmitted on antennas without retransmission requests.

In the case of retransmission using method II, retransmission data is transmitted using not the same antenna, but the antenna where the error did not occur at the previous transmission. By transmitting retransmission data through antennas that are considered to be more reliable, retransmission data is likely to have no error, thereby increasing the data accuracy. The assumption of an antenna being reliable if an ACK is received for that particular antenna is applied to a stable environment where fading is slow or static.

The above two methods have a difference in antenna allocation. In method I where allocation is not performed, data processing kept to a minimum, thereby reducing complexity. Therefore, the processing delay in this case will be short. For method II, attention has to be put to both transmission and receiving buffers due to the changed data setting. The transmitter needs to inform the receiver of the difference in arrangement between previous and current transmissions so that the buffers can be properly updated. This notification from the transmitter to the receiver is regulated by an upper layer. This method II aims at improving the accuracy of retransmission to reduce the number of retransmissions requested for a data frame.

Methods I and II is useful to systems which allow error. For such systems, transmission of a large volume of data in a short time is required while the accuracy follows next. Some examples of such applications include video streaming and facsimile. Compared to method I, method II is suitable for systems which do not allow delay.

On the other hand, when the system does not allow error, methods III or IV is more suitable. In this case, obtaining a right accuracy is given the highest priority. These applications include e-commerce, web browsing, email access and other interactive services such as instant messaging.

Figure 6:
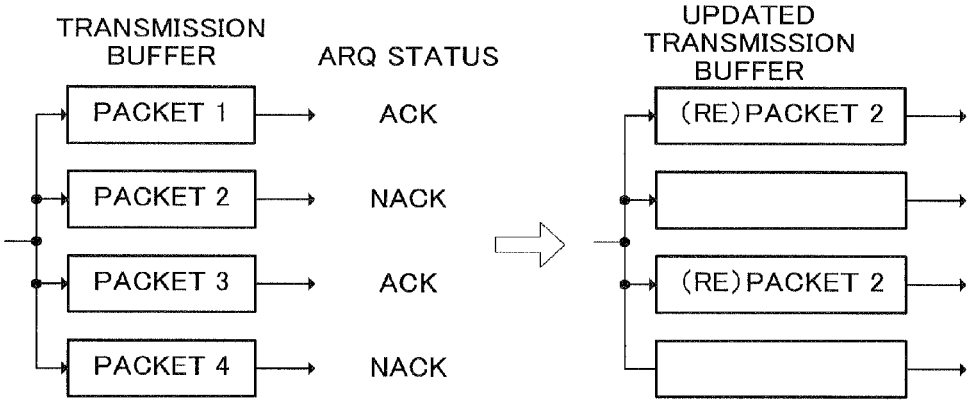
FIG. 6 shows an example of scenario for the retransmission setting of data packets by a retransmission method of the present invention.
Figure 7:
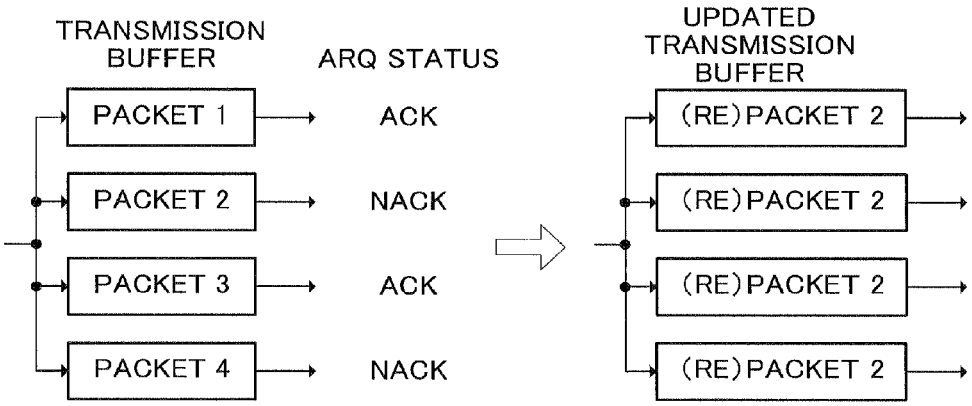
FIG. 7 shows an example of scenario for the retransmission setting of data packets by a retransmission method of the present invention.

FIG. 6 and FIG. 7 show examples of the previous transmission status and the current retransmission arrangement for methods III and IV. Data is retransmitted using space-time block coding (STBC) that is the spatial diversity technique for higher accuracy of retransmission data. In both methods, new data transmission does not occur simultaneously with the data retransmission. If retransmission is requested, antennas will be used for this purpose only.

In another embodiment of the present invention, as shown in FIG. 4C, retransmission of data packets using method III is carried out on those reliable antennas (antennas where ACKs are received in the previous transmission). Transmissions do not occur for the rest of the antennas.

In a further embodiment of the present invention using method IV, data to be retransmitted is transmitted using STBC on all available antennas. Therefore, the probability of error at the receiver is greatly reduced.

For both methods III and IV, in the example where two data packets need to be retransmitted, packet 2 is retransmitted at the first slot while packet 4 is retransmitted at the next slot. One way of improving the efficiency is to use a higher order of modulation so that the retransmission data rate can be improved. More retransmission data can be transmitted at the same instance if this solution is employed.

Unlike method IV, method III aims at reducing the time for processing at the receiver. Usage of fewer transmission antennas makes the decoding for STBC straight forward and fast. Furthermore, by retransmitting on reliable antennas, method III attempts to achieve a balance between complexity and accuracy. Although method IV is more complicated and takes more time, a higher accuracy of retransmission is obtained compared to method III. Therefore, method III is suitable for system which allows not error, but delay.

One aspect of this present invention is that selection of methods may vary according to the performed retransmissions. This is because the system requests may change after a certain number of retransmissions of the same data packet. For instance, system which allows error selects method I or II for retransmission. However, after a couple of retransmissions, the same data packet is still in error. Hence, to improve the accuracy of that packet, retransmission mode selecting section 312 may decide on a more accurate method III or IV. Instructions to switch retransmission methods are regulated by the upper layer.

A variation on the above embodiments is to employ ARQ using incremental redundancy instead of simple chase combining. Incremental redundancy information is transmitted in a retransmission packet for further improvement of performance during decoding process.

As another variation on the above embodiments, an interleaving pattern may be employed at retransmission. OFDM sub-carriers may experience different fading. When channel state information (CSI) is present, bit loading may be performed. For the present invention where CSI is not obtained at the transmitter, equal bit loading is employed. To utilize the sub-carrier fading differences, interleaving pattern is varied for each retransmission to balance the effects of fading.

In a further variation on the above embodiments, adaptive modulation, coding and power control may be employed concurrently with the present invention. Information obtained from long-term statistics of ARQ is helpful in identifying those reliable antennas. Those antennas having a low average rate of retransmissions is considered to be reliable. A higher order of modulation or a higher rate of coding can be employed on such antennas, whereas higher power can be applied to the other antennas to make signal strength higher. Using ARQ statistics as control information instead of the conventional use of CSI for link adaptation is useful for a method that is not complicated and does not take much time in determining the differences in link quality.

The above description is considered to be the preferred embodiment of the present invention, but the present invention is not limited to the disclosed embodiments, and may be implemented in various forms and embodiments and that its scope should be determined by reference to the claims hereinafter provided and their equivalents.

INDUSTRIAL APPLICABILITY

The present invention is suitable for using a multiple-input multiple-output (MIMO) communication system employing orthogonal frequency division multiplexing (OFDM).

The invention claimed is:

1. A method in a [multiple-input multiple-output (MIMO)] communications system *that includes a transmitter having a plurality of transmitter antennas and a receiver having a plurality of receiver antennas*, for retransmitting data, the method comprising:

identifying that a portion of data is to be retransmitted based on a feedback information indicating that the portion of data received a negative acknowledgement (NACK) during a cyclic redundancy check (CRC) on a previous transmission of the portion of data;

determining [an error allowance of] an application type associated with the portion of data;

selecting a retransmission mode for retransmitting the portion of data based on [the error allowance of] the application type associated with the portion of data, including:

based at least on [determining that] the application type [allows] *allowing* for error by prioritizing volume of data transfer over data transfer accuracy, selecting a first mode of retransmission that retransmits the portion of data on at least a first transmitter antenna while transmitting new data on at least a second transmitter antenna; or based at least on [determining that] the application type [does] not [allow] *allowing* for error by prioritizing data transfer accuracy over volume of data transfer, selecting a second mode of retransmission that retransmits the portion of data simultaneously on at least the first and second transmitter antennas; and retransmitting the portion of data using the selected mode of retransmission.

2. The method of claim 1, wherein the second mode of retransmission retransmits the portion of data simultaneously on at least the first and second transmitter antennas using space-time block coding (STBC).

3. The method of claim 1, wherein the first mode of retransmission retransmits the portion *of* data on the same transmitter antenna on which it was previously transmitted.

4. The method of claim 1, wherein the first mode of retransmission retransmits the portion *of* data on a different transmitter antenna than the one on which it was previously transmitted.

5. The method of claim 1, wherein the second mode of retransmission retransmits the portion *of* data only on one or more transmitter antennas that transmitted data that received an acknowledgement (ACK) during a previous transmission.

6. The method of claim 1, wherein the second mode of retransmission retransmits the portion *of* data both on one or more transmitter antennas that transmitted data that received an acknowledgement (ACK) during a previous transmission and one or more transmitter antennas that transmitted data that received [an] *a* NACK during a previous transmission.

7. The method of claim 1, further comprising storing long-term retransmissions statistics for each transmitter antenna.

8. The method of claim 1, wherein the feedback information is determined based on an incremental redundancy method.

9. The method of claim 1, wherein selecting the retransmission mode for retransmitting the portion of data also includes selecting the retransmission mode based at least on one or more of latency, performance level, or quality of services associated with the portion of data.

10. The method of claim 1, wherein the application type is determined to allow for error when the portion of data is associated with video streaming or facsimile, and the application type is determined to not allow for error when the portion of data is associated with web browsing, email access, or instant messaging.

11. The method of claim 1, wherein the application type is selected from the group consisting of video, facsimile, web browsing, email, and instant messaging.

12. A transmitter in a multiple-input multiple-output (MIMO) communication system, comprising:

an [identifying section] *ARQ controller* that: (*i*) identifies a portion of data that is to be retransmitted based on a feedback information from a receiver indicating that the portion of data received a negative acknowledgement (NACK) during a cyclic redundancy check (CRC) on a previous transmission of the portion of data; *and*

[a selecting section that] (*ii*) selects a retransmission mode for the portion of data based at least on an [error allowance of the] application type associated with the portion of data, wherein the [selecting section] *ARQ controller* selects from among at least:

a first mode of retransmission that retransmits the portion of data on at least a first transmitter antenna while transmitting new data on at least a second transmitter antenna, when the application type allows for error by prioritizing volume of data transfer over data transfer accuracy; and a second mode of retransmission that retransmits the portion of data simultaneously on at least the first and second transmitter antennas, when the application type does not allow for error by prioritizing data transfer accuracy over volume of data transfer; and a [transmitting section] *set of antennas* that retransmits the portion of data using the selected mode of retransmission.

13. The transmitter of claim 12, wherein the second mode of retransmission retransmits the portion of data simultaneously on at least the first and second transmitter antennas using space-time block coding (STBC).

14. The transmitter of claim 12, *wherein* the first mode of retransmission retransmits the portion *of* data on the same transmitter antenna on which it was previously transmitted.

15. The transmitter of claim 12, *wherein* the first mode of retransmission retransmits the portion *of* data on a different transmitter antenna than the one on which it was previously transmitted.

16. The transmitter of claim 12, wherein the second mode of retransmission retransmits the portion *of* data only on one or more transmitter antennas that transmitted data that received an acknowledgement (ACK) during a previous transmission.

17. The transmitter of claim 12, wherein the second mode of retransmission retransmits the portion *of* data both on one or more transmitter antennas that transmitted data that received an acknowledgement (ACK) during a previous transmission and one or more transmitter antennas that transmitted data that received [an] *a* NACK during a previous transmission.

18. The transmitter of claim 12, wherein the transmitter retransmits according to the feedback information that is determined based on an incremental redundancy method.

19. The transmitter of claim 12, wherein the [selecting section] *ARQ controller* also selects the retransmission mode based at least on one or more of latency, performance level, or quality of services associated with the portion of data.

20. The transmitter of claim 12, wherein the application type is determined to allow for error based at least on the portion of data being associated with video streaming or facsimile, and wherein the application type is determined to not allow for error based at least on the portion of data being associated with web browsing, email access, or instant messaging.

21. A computer program product comprising one or more non-transitory computer-readable media having stored thereon computer-executable instructions that, when executed by one or more processors of a multiple-input multiple-output (MIMO) communication system, cause a transmitter of the MIMO communication system to retransmit data, including:

identifying that a portion of data is to be retransmitted based on a feedback information from a receiver indicating that the portion of data received a negative acknowledgement (NACK) during a cyclic redundancy check (CRC) on a previous transmission of the portion of data;

determining [an error allowance of] an application type associated with the portion of data;

selecting a retransmission mode for retransmitting the portion of data based on [the error allowance of] the application type associated with the portion of data, including:

based at least on [determining that] the application type [allows] *allowing* for error by prioritizing volume of data transfer over data transfer accuracy, selecting a first mode of retransmission that retransmits the portion of data on at least a first transmitter antenna while transmitting new data on at least a second transmitter antenna; or based at least on [determining that] the application type [does] not [allow] *allowing* for error by prioritizing data transfer accuracy over volume of data transfer, selecting a second mode of retransmission that retransmits the portion of data simultaneously on at least the first and second transmitter antennas; and retransmitting the portion of data using the selected mode of retransmission.

22. The computer program product of claim 21, wherein the first mode retransmits the portion of data on the same antenna on which it was previously transmitted.

23. The computer program product of claim 21, wherein the first mode retransmits the portion of data on a different antenna than the one on which it was previously transmitted.

24. The computer program product of claim 21, wherein the second mode retransmits the portion of data only on one or more antennas that transmitted data that received an ACK during a previous transmission.

25. The computer program product of claim 21, wherein the second mode retransmits the portion of data both on one or more antennas that transmitted data that received an ACK during a previous transmission and one or more antennas that transmitted data that received [an] *a* NACK during a previous transmission.

26. The computer program product of claim 21, wherein selecting the retransmission mode for retransmitting the portion of data also includes selecting the retransmission mode based at least on one or more of latency, performance level, or quality of services associated with the portion of data.

27. The computer program product of claim 21, wherein the application type is determined to allow for error when the portion of data is associated with video streaming or facsimile, and the application type is determined to not allow for error when the portion of data is associated with web browsing, email access, or instant messaging.

28. The computer program product of claim 21, wherein the application type is selected from the group consisting of video, facsimile, web browsing, email, and instant messaging.

* * * * *